(12) United States Patent  
Ura

(10) Patent No.: US 8,305,119 B2
(45) Date of Patent: Nov. 6, 2012

(54) CLOCK GENERATION CIRCUIT

(75) Inventor: Junya Ura, Iwata (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 13/217,728

(22) Filed: Aug. 25, 2011

(65) Prior Publication Data
US 2012/0049911 A1   Mar. 1, 2012

(30) Foreign Application Priority Data

Aug. 26, 2010 (JP) ................................ 2010-189050

(51) Int. Cl.
H03L 7/06 (2006.01)
(52) U.S. Cl. ......... 327/156; 327/147; 327/149; 327/158
(58) Field of Classification Search .................. 327/147, 327/149, 156, 158
See application file for complete search history.

(56) References Cited

U.S. PATENT DOCUMENTS

| 6,067,335 | A  | * | 5/2000 | Yamanoi et al. | 375/374 |
| 6,703,876 | B2 | * | 3/2004 | Fujiwara et al. | 327/156 |
| 6,970,030 | B1 | * | 11/2005 | Huang et al. | 327/296 |
| 7,236,024 | B2 | * | 6/2007 | Huang et al. | 327/147 |
| 7,800,451 | B2 | * | 9/2010 | Fu et al. | 331/4 |
| 2001/0015678 | A1 | * | 8/2001 | Wesolowski | 331/14 |
| 2002/0075982 | A1 | * | 6/2002 | Doblar | 375/376 |
| 2011/0215846 | A1 | * | 9/2011 | Furuta | 327/148 |
| 2012/0049911 | A1 | * | 3/2012 | Ura | 327/156 |

FOREIGN PATENT DOCUMENTS

JP   2001-126411 A   5/2001

* cited by examiner

Primary Examiner — Lincoln Donovan
Assistant Examiner — Adam Houston
(74) Attorney, Agent, or Firm — Crowell & Moring LLP

(57) ABSTRACT

A clock generation circuit includes a first divider, a loop unit that has a second divider and generates an output clock which is in phase synchronization with a reference clock of the first divider and has a frequency that is F times the reference clock, a clock switching unit that selects one input clock among a plurality of input clocks and supplies the selected input clock to the first divider, and a timing control unit. The timing control unit switches the clock selection command in accordance with switching of clock selection information, switches at least one of a setting of the number R of the input clocks and a setting of the number F of the output clocks, and starts both of a count operation by using the first divider and a count operation by using the second divider after switching of the setting.

5 Claims, 13 Drawing Sheets

CLOCK GENERATION CIRCUIT

BACKGROUND

The present invention relates to a clock generation circuit using a PLL (Phase Locked Loop).

A PLL is a circuit which generates a clock that is phase-locked in an input signal, and has been used in various kinds of fields. FIG. 12 is a block diagram illustrating a general configuration of a PLL. In FIG. 12, a divider 1 divides an input clock CLKI in a preset division ratio 1/R, and outputs a reference clock CLKREF having a frequency that is 1/R of the input clock CLKI to a phase comparator 3 of a loop unit 2. The loop unit 2 is a circuit in which the phase comparator 3, a loop filter 4, a VCO (Voltage Controlled Oscillator) 5, and a divider 6 are connected in the form of a loop. Here, the phase comparator 3 compares phases of the reference clock CLKREF and a feedback clock CLKFB output from the divider 6, and outputs a phase error signal that indicates the phase error between the reference clock CLKREF and the feedback clock CLKFB. The loop filter 4 removes a high frequency component of the phase error signal, and outputs the phase error signal as a frequency control voltage. The VCO 5 oscillates with a frequency according to the frequency control voltage, and generates an output clock signal CLKO. The divider 6 divides the output clock CLKO in a preset division ratio 1/F, and outputs a feedback clock CLKFB having a frequency that is 1/F of the output clock CLKO to the phase comparator 3.

In this configuration, if the phase of the feedback clock CLKFB is delayed with respect to the phase of the reference clock CLKREF, the phase error signal that indicates the delay amount is output from the phase comparator 3. Accordingly, the frequency control voltage is increased to increase the frequency of the output clock CLKO, and feedback control is performed to make the phase of the feedback clock CLKFB relatively precede the phase of the reference clock CLKREF. On the other hand, in the case where the phase of the feedback clock CLKFB precedes the phase of the reference clock CLKREF, the phase error signal that indicates the amount of the advance is output from the phase comparator 3. Accordingly, the frequency control voltage is lowered to lower the frequency of the output clock CLKO, and feedback control is performed to make the phase of the feedback clock CLKFB be delayed relative to in respect to the phase of the reference clock CLKREF. As a result of performing the feedback control, the phase of the feedback clock CLKFB is synchronized with the phase of the reference clock CLKREF to be synchronized with the phase of the input clock CLKI, and an output clock CLKO having a frequency that is F/R times the input clock CLKI is obtained from the VCO 5.

As described above, the PLL is required to receive the supply of the input clock CLKI in order to generate the output clock CLKO. Here, in the case where a device that is a source of the input clock CLKI operates at all time, and the input clock CLKI is normally supplied to the PLL, it is possible for the PLL to generate the output clock CLKO for a device in which the PLL is installed using its input clock CLKI. However, according to systems, it may be difficult to constantly supply the input clock CLKI to the PLL through constant operation of a specified device. Accordingly, configuring a system may be considered in a manner such that a plurality of devices that are sources of the input clock CLKI (for example, device A and device B) is determined, and in the case where the device B stops its operation, for example, an input clock CLKI0 is supplied from the device A to the PLL, while in the case where the device A stops its operation, for example, an input clock CLKI1 is supplied from the device B to the PLL. According to this system, the supply of the input clock to the PLL is not intercepted, and for the device in which the PLL is installed, the PLL so continuously generates the output clock CLKO. However, the frequency of the input clock CLKI0 that is output by the device A may be different from the frequency of the input clock CLKI1 that is output by the device B. In this case, in order to generate the output clock CLKO having the same frequency to the PLL after switching the input clock, it is necessary to change the division ratio 1/R of the divider 1 or the division ratio 1/F of the divider 6 to suit the frequency of the input clock after the switching. However, even though the division ratio has been changed, the PLL moves out of synchronization when the switching of the input clock is performed, and thus the frequency of the output clock CLKO becomes unstable over a long term.

Here, with reference to FIG. 13, the above described problem will be described. FIG. 13 illustrates a counted value CNT1 of the input clock CLKI in the divider 1, the generation situation of the reference clock CLKREF, a counted value CNT6 of the output clock CLKO in the divider 6, and the generation situation of the feedback clock CLKFB. In this example, the divider 1 repeatedly performs down count for the input clock CLKI, and if the counted value becomes "0", the divider 1 sets the counted value to R−1, and generates the reference clock CLKREF. Also, the divider 6 repeatedly performs down count for the output clock CLKO, and if the counted value becomes "0", the divider 6 sets the counted value to F−1, and generates the feedback clock CLKFB. In a state where the feedback clock CLKFB is phase-synchronized with the reference clock CLKREF, the change of the counted value CNT1 of the divider 1 is in synchronization with the change of the counted value CNT6 of the divider 6.

The switching of the input clock CLKI is performed while the above described operation is performed, and if the frequency of the input clock after the switching becomes higher than that before the switching, as indicated by a broken line L1, the time gradient of the counted value CNT1 becomes steep, and thus the reference clock CLKREF is generated to be earlier than the generation timing of the feedback clock CLKFB. By contrast, if the frequency of the input clock after the switching becomes lower than that before the switching, as indicated by a broken line L2, the time gradient of the counted value CNT1 becomes shallow, and thus the reference clock CLKREF is generated to be delayed with respect to the generation timing of the feedback clock CLKFB. If the reference clock CLKREF having a large phase difference with respect to the feedback clock CLKFB is output to the phase comparator 3, a large phase error signal is generated, and thus the PLL moves out of synchronization.

SUMMARY

The present invention has been made in consideration of the above described circumstances, and an object of the present invention is to provide a clock generation circuit that can perform switching of an input clock and switching of a division ratio according to the switching of the input clock, without moving out of synchronization, in a state where a PLL is operated.

In order to achieve the above object, according to the present invention, there is provided a clock generation circuit, comprising:

a first divider that outputs a reference clock everytime the number R (R is an integer) of input clocks are counted;

a loop unit that includes a second divider which outputs a feedback clock everytime the number F (F is an integer) of output clocks are counted, and generates an output clock, which is in phase synchronization with the reference clock and has a frequency that is F times the reference clock, by controlling a frequency of the output clock based on a phase error between the reference clock and the feedback clock;

a clock switching unit that selects one input clock which is designated by a clock selection command among a plurality of input clocks and supplies the selected input clock to the first divider; and a timing control unit that switches the clock selection command for the clock switching unit in accordance with switching of clock selection information which designates the input clock, switches at least one of a setting of the number R of the input clocks for outputting one reference clock to the first divider and a setting of the number F of the output clocks for outputting one feedback clock to the second divider, and starts both of a count operation by using the first divider of the input clock corresponding to the set number R after switching of the setting and a count operation by using the second divider of the output clock corresponding to the set number F after switching of the setting.

Preferably, the timing control unit switches the clock selection command for the clock switching unit in accordance with a counted value of the input clock in the first divider or a counted value of the output clock in the second divider becoming a predetermined value after the clock selection information is switched, and makes the first divider and the second divider start the count operation of the input clock corresponding to the set number R after the switching of the setting and the count operation of the output clock corresponding to the set number F after the switching of the setting in time with the start of the output of the input clock designated by the switched clock is selection command, by the clock switching unit.

Preferably, the clock switching unit outputs the input clock which is delayed with respect to the switching of the clock selection command and designated by the clock selection command after the switching; and the timing control unit stops the first divider and the second divider in accordance with the switching of the clock selection command for the clock switching unit, and makes the first divider and the second divider start the count operation of the input clock corresponding to the set number R after the switching of the setting and the count operation of the output clock corresponding to the set number F after the switching of the setting in time with the start of the output of the input clock designated by the switched clock selection command, by the clock switching unit.

Preferably, the timing control unit stops the first divider in accordance with the switching of the clock selection command for the clock switching unit, and then stops the second divider after a period of time is elapsed.

Preferably, the timing control unit switches the clock selection command for the clock switching unit in accordance with the first divider outputting the reference clock after the switching of the clock selection information.

According to the above configurations, the timing control unit switches the clock selection command for the clock switching unit in accordance with the switching of the clock selection information that designates the input clock, and switches at least one of the setting of the number R of the input clocks for outputting one reference clock to the first divider and the setting of the number F of the output clocks for outputting one feedback clock to the second divider. Also, the timing control unit starts both of the count operation by using the first divider of the input clock corresponding to the set number R after the switching of the setting and the count operation by using the second divider of the output clock corresponding to the set number F after the switching of the setting. Here, after the switching of the input clock, the input clock output to the first divider is asynchronous with the output clock output to the second divider, and the first and second dividers, although their edges do not coincide with each other, almost simultaneously start the division operation in a new division ratio that corresponds to the input clock after the switching, under the control of the timing control unit, and then output the reference clock and the feedback clock at most the same timing. Accordingly, the loop unit is prevented from moving out of synchronization.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Exemplary embodiments of the invention will be described with reference to the accompanying drawings.

<First Embodiment>

Figure 1:
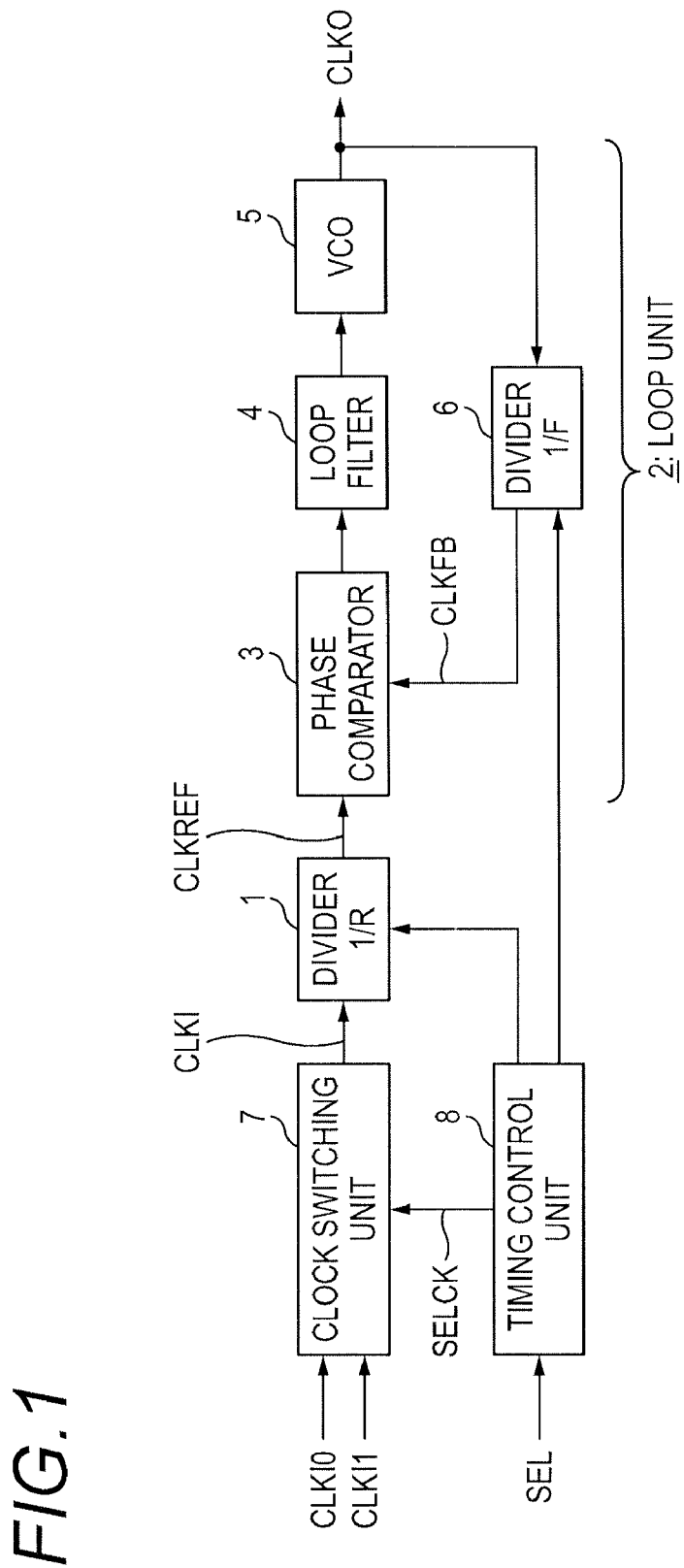
FIG. 1 is a block diagram illustrating the basic configuration of a clock generation circuit according to a first embodiment of the invention.
Figure 12:
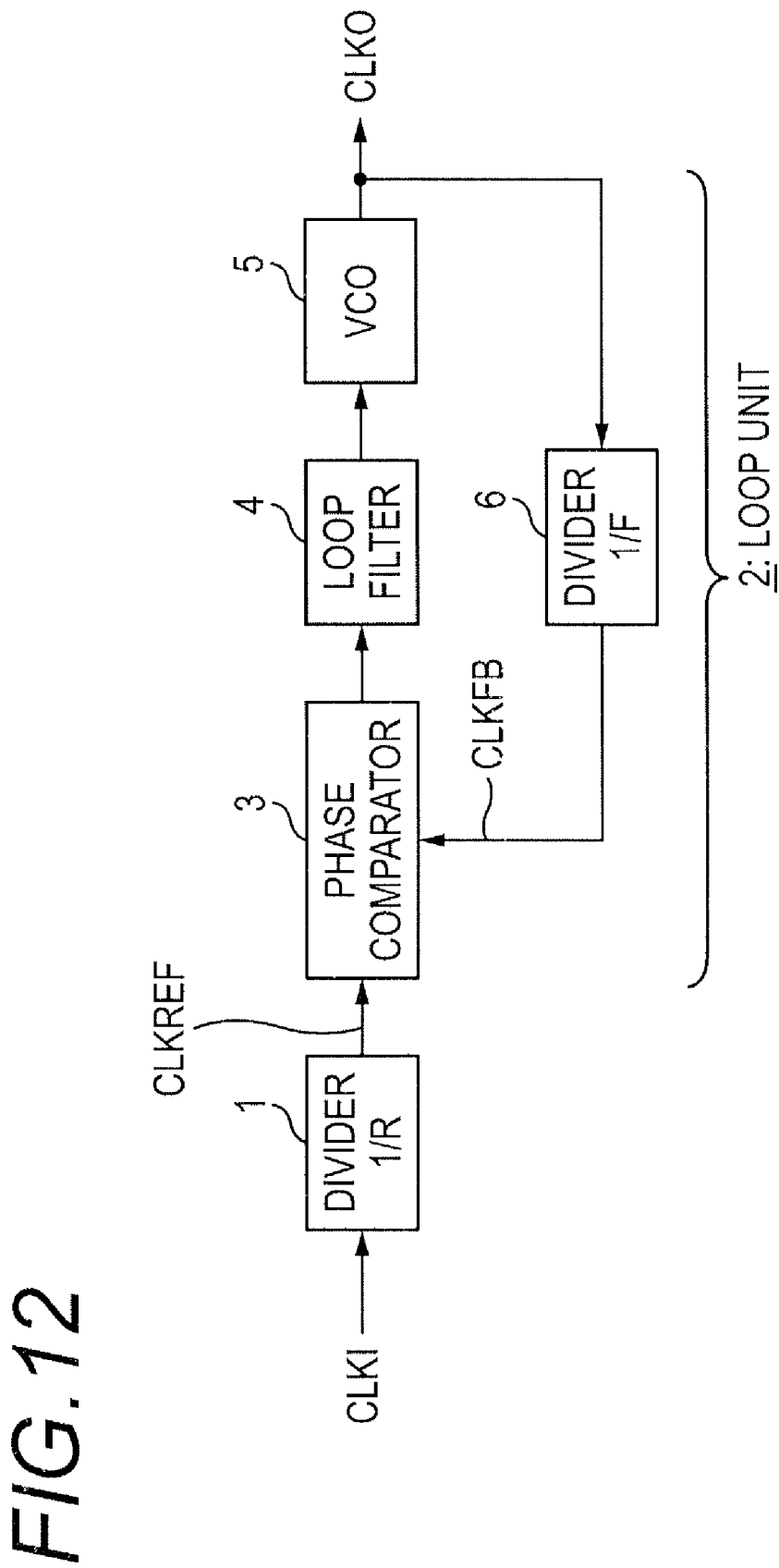
FIG. 12 is a block diagram illustrating the configuration of a related PLL.
Figure 13:
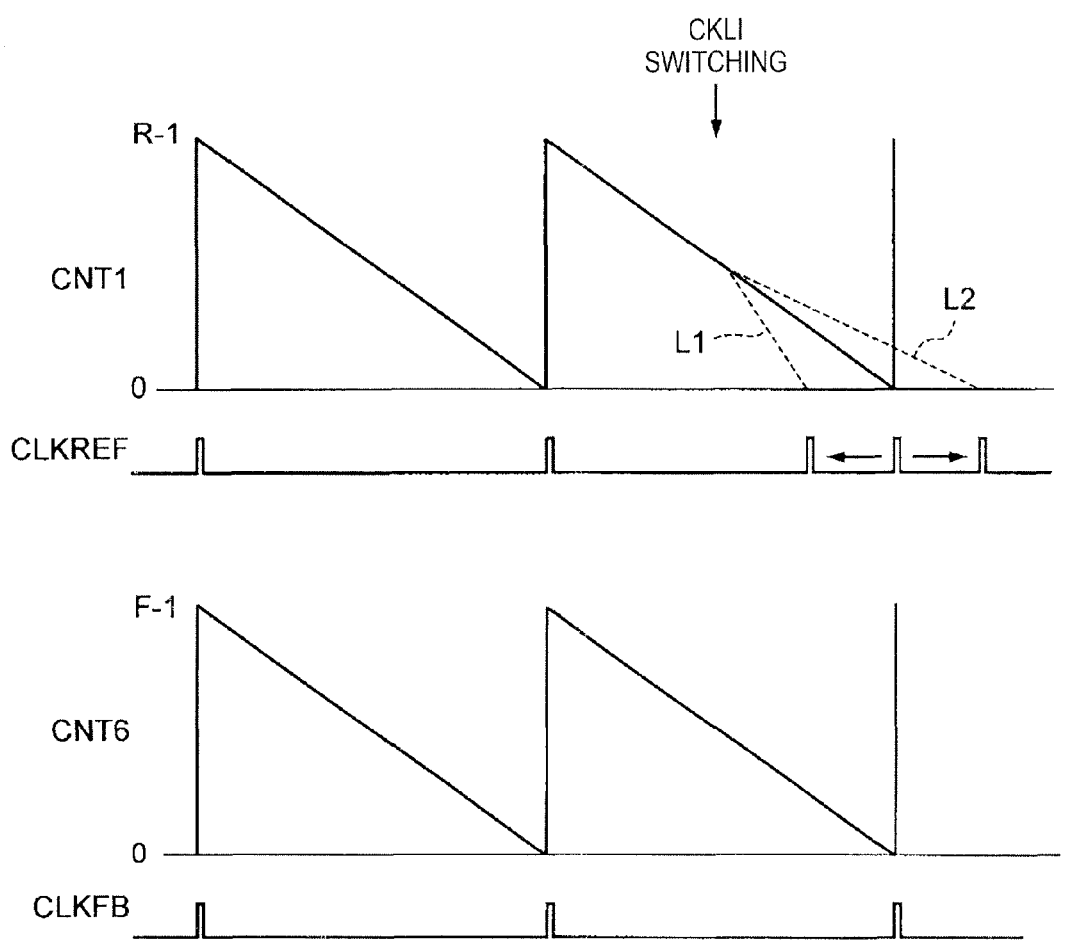
FIG. 13 is a time chart illustrating problems occurring in the case of performing switching of an input clock in the related PLL.

FIG. 1 is a block diagram illustrating the basic configuration of a clock generation circuit according to a first embodiment of the invention. In FIG. 1, the circuit configuration of a portion having a divider 1 and a loop unit 2 is basically the same as that as illustrated in FIG. 12.

The feature of the clock generation circuit according to the first embodiment of the invention is a clock switching unit 7 and a timing control unit 8 which are added to the circuit having the divider 1 and the loop unit 2. Input clocks CLKI0 and CLKI1 having different frequencies to each other are output to the clock switching unit 7. The clock switching unit 7 selects one of the input clocks CLKI0 and CLKI1 according to a clock selection command SELCK output from the timing control unit 8 and supplies the selected clock to the divider 1 as an input clock CLKI. The timing control unit 8 generates the clock selection command SELCK for the clock switching unit 7 and controls the operation of the dividers 1 and 6 in accordance with clock selection information SEL supplied from an upper side device.

More specifically, if it is assumed that the frequency of the input clock CLKI0 is fi0, the frequency of the input clock CLKI1 is fi1, and the frequency of an output clock CLKO of a VCO 5 is fo, the timing control unit 8 stores a set of division ratio data RA and FA and a set of division ratio data RB and FB, which satisfy the following equations (1) and (2), respectively, without changing the frequency fo of the output clock CLKO.

$$fi0/(RA+1)=fo/(FA+1) \quad (1)$$

$$fi1/(RB+1)=fo/(FB+1) \quad (2)$$

Also, in the case of outputting the clock selection command SELCK that controls the selection of the input clock CLKI0, the timing control unit 8 sets the division ratio data RA and FA that are suitable for the input clock CLKI0 in the dividers 1 and 6, respectively, while in the case of outputting the clock selection command SELCK that controls the selection of the input clock CLKI1, the timing control unit 8 sets the division ratio data RB and FB that are suitable for the input clock CLKI1 in the dividers 1 and 6, respectively. At this time, the timing control unit 8 resets and stops the dividers 1 and 6 at a start of the switching operation of the input clock CLKI to prevent the loop unit 2 from moving out of synchronization, sets the respective division ratios that are suitable for the input clock CLKI after switching in the dividers 1 and 6, respectively, and controls the dividers 1 and 6 to simultaneously start the division operation after completion of the switching of the input clock CLKI. By performing this control, a reference clock CLKREF and a feedback clock CLKFB are supplied to the phase comparator 3 with the same phase after completion of the switching of the input clock CLKI, and thus the loop unit 2 is prevented from moving out of synchronization.

Figure 2:
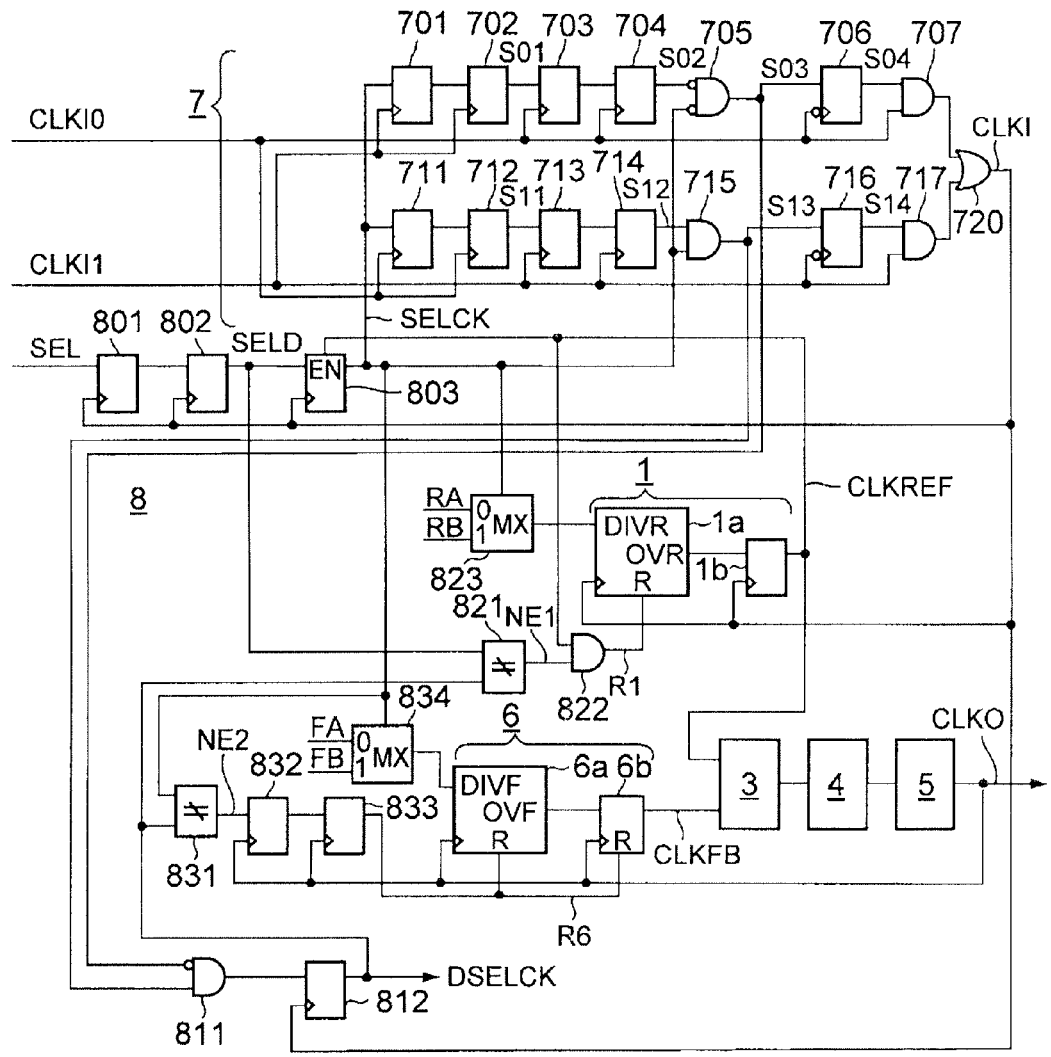
FIG. 2 is a circuit diagram illustrating the detailed configuration of the clock generation circuit.

FIG. 2 is a circuit diagram illustrating the detailed configuration of a clock generation circuit according to the embodiment of the invention. First, the clock switching unit 7 will be described. Input clocks CLKI0 and CLKI1 and a clock selection command SELCK generated by the timing control unit 8 are output to the clock switching unit 7. Flip-flops 701 and 702 sequentially shift the clock selection command SELCK in synchronization with a rising edge of the input clock CLKI1. Flip-flops 703 and 704 sequentially shift an output signal S01 of the flip-flop 702 in synchronization with the rising edge of the input clock CLKI0. An AND gate 705 sets an output signal S03 to "1" in the case where both an output signal S02 of the flip-flop 704 and the clock selection command SELCK are "0", and sets the output signal S03 to "0" in other cases. A flip-flop 706 receives and outputs the output signal S03 of the AND gate 705 in synchronization with a falling edge of the input clock CLKI0. An AND gate 707 passes the input clock CLKI0 in the case where an output signal S04 of the flip-flop 706 is "1", and outputs "0" in other cases.

Flip-flops 711 and 712 sequentially shift the clock selection command SELCK in synchronization with a rising edge of the input clock CLKI0. Flip-flops 713 and 714 sequentially shift an output signal S11 of the flip-flop 712 in synchronization with the rising edge of the input clock CLKI1. An AND gate 715 sets an output signal S13 to "1" in the case where both an output signal S12 of the flip-flop 714 and the clock selection command SELCK are "1", and sets the output signal S13 to "0" in other cases. A flip-flop 716 receives and outputs the output signal S13 of the AND gate 715 in synchronization with a falling edge of the input clock CLKI1. An AND gate 717 passes the input clock CLKI1 in the case where an output signal S14 of the flip-flop 716 is "1", and outputs "0" in other cases. In the case where the input clock CLKI0 passes through the AND gate 707, an OR gate 720 outputs its input clock CLKI0 as the input clock CLKI, and in the case where the input clock CLKI1 passes through the AND gate 717, the OR gate 720 outputs its input clock CLKI1 as the input clock CLKI. The foregoing is the configuration of the clock switching unit 7.

An outline of the function of the clock switching unit 7 is as follows. First, when the clock selection command SELCK becomes "0", the output signal S03 of the AND gate 705 and the output signal S04 of the flip-flop 706 in the clock switching unit 7 finally become "1", and the output signal S13 of the AND gate 715 and the output signal S14 of the flip-flop 716 become "0". Accordingly, the input clock CLKI0 passes through the AND gate 707 and the OR gate 720, and is output as the input clock CLKI. Also, when the clock selection command SELCK becomes "1", the output signal S03 of the AND gate 705 and the output signal S04 of the flip-flop 706 in the clock switching unit 7 finally become "0", and the output signal S13 of the AND gate 715 and the output signal S14 of the flip-flop 716 become "1". Accordingly, the input clock CLKI1 passes through the AND gate 717 and the OR gate 720, and is output as the input clock CLKI. In this case, the detailed operation of respective units of the clock switching unit 7 will be described later.

Next, the dividers 1 and 6 will be described. The divider 1 has a down counter 1a and a flip-flop 1b. Here, the down counter 1a is a counter that repeats operations of subtracting the counted value CNT1 one by one in synchronization with the rising edge of the input clock CLKI from the clock switching unit 7 and receiving division ratio data DIVR as the counted value CNT1 in synchronization with the rising edge of the subsequent input clock CLKI when the counted value CNT1 becomes "0". Also, when a reset signal R1 that is output to a reset terminal R becomes "1", the down counter 1a resets the counted value CNT1 to "0" in synchronization with the rising edge of the subsequent input clock CLKI. Also, the down counter 1a sets a count end signal OVR to "1" in a period when the counted value CNT1 is "0", and sets the count end signal OVR to "0" in a period when the counted value CNT1 is a value except for "0". The flip-flop 1b receives the count end signal OVR output from the down counter 1a in synchronization with the rising edge of the input clock CLKI, and outputs the count end signal OVR to the phase comparator 3 as the reference clock CLKREF.

The divider 6 has a down counter 6a and a flip-flop 6b. Here, the down counter 6a is a counter that repeats operations of subtracting the counted value CNT6 one by one in synchronization with the rising edge of the output clock CLKO from the VCO 5 and receiving division ratio data DIVF as the counted value CNT6 in synchronization with the rising edge of the subsequent output clock CLKO when the counted value CNT6 becomes "0". Also, when a reset signal R6 that is output to the reset terminal R becomes "1", the down counter 6a resets the counted value CNT6 to "0" in synchronization with the rising edge of the subsequent output clock CLKO. Also, the down counter 6a sets a count end signal OVF to "1" in a period when the counted value CNT6 is "0", and sets the count end signal OVF to "0" in a period when the counted value CNT6 is a value except for "0". The flip-flop 6b receives the count end signal OVF output from the down counter 6a in synchronization with the rising edge of the output clock CLKO, and outputs the count end signal OVF to the phase comparator 3 as the feedback clock CLKFB.

Next, the timing control unit 8 will be described. Flip-flops 801 to 803 configure a circuit which generates the clock selection command SELCK based on the clock selection information SEL that is output from an upper device. First, the flip-flops 801 and 802 sequentially shift the clock selection information SEL in synchronization with the rising edge of the input clock CLKI, and output the shifted clock selection information as a signal SELD. Also, the flip-flop 803 receives the output signal SELD of the flip-flop 802 in synchronization with the rising edge of the input clock CLKI in a period when the reference clock CLKREF that is output to an enable terminal EN is "1", and outputs the received signal as the clock selection command SELCK. The clock switching unit 7 as described above selects the input clock based on the clock selection command SELCK.

An AND gate 811 and a flip-flop 812 configure a circuit which outputs a clock determination signal DSELCK that indicates which of the input clocks CLKI0 and CLKI1 is currently output as the input clock CLKI. Here, the AND gate 811 outputs "1" when the output signal S03 of the AND gate 705 of the clock switching unit 7 is "0" and the output signal S13 of the AND gate 715 is "1", and outputs "0" in other cases. Also, the flip-flop 812 receives the output signal of the AND gate 811 in synchronization with the rising edge of the input clock CLKI, and outputs the received signal as the clock determination signal DSELCK. The clock determination signal DSELCK goes from "0" to "1" when an operation that outputs the input clock CLKI1 as the input clock CLKI starts after the clock selection command SELCK is shifted from "0" to "1". Also, the clock determination signal DSELCK goes from "1" to "0" when the operation that outputs the input clock CLKI0 as the input clock CLKI starts after the clock selection command SELCK is switched from "1" to "0". In this case, the details of the operation that generates the clock determination signal DSELCK will be described later.

An inconsistency detection unit 821 and an AND gate 822 configure a circuit that supplies the reference clock CLKREF to the divider 1 as a reset signal R1 when the divider 1 generates the reference clock CLKREF after the clock selection information SEL is switched. More specifically, the inconsistency detection unit 821 sets an inconsistency detection signal NE1 to "0" when the output signal SELD of the flip-flop 802 coincides with the clock determination signal DSELCK, and sets the inconsistency detection signal NE1 to "1" when the output signal SELD does not coincide with the clock determination signal DSELCK. Also, the AND gate 822 supplies the reference clock CLKREF that is generated in a period when the inconsistency detection signal NE1 is "1" to the down counter 1a of the divider 1 as the reset signal R1.

A multiplexer 823 selects the division ratio data RA that corresponds to the input clock CLKI0 in the case where the clock selection command SELCK is "0", selects the division ratio data RB that corresponds to the input clock CLKI1 in the case where the clock selection command SELCK is "1", and supplies the selected division ratio data to the down counter 1a as the division ratio data DIVR.

An inconsistency detection unit 831 and flip-flops 832 and 833 configure a circuit that stops the operation of the divider 6 in a period when the input clock CLKI0 or CLKI1 which is designated by the clock selection command SELCK that has been changed starts to be output as the input clock CLKI. More specifically, the inconsistency detection unit 831 sets an inconsistency detection signal NE2 to "0" when the clock selection command SELCK coincides with the clock determination circuit DSELCK, and sets the inconsistency detection signal NE2 to "1" when the clock selection command SELCK does not coincide with the clock determination circuit DSELCK. The flip-flops 832 and 833 sequentially shift the inconsistency detection signal NE2 in synchronization with the rising edge of the output clock CLKO, and outputs the shifted inconsistency detection signal NE2 to the down counter 6a and the flip-flop 6b as the reset signal R6.

A multiplexer 834 selects the division ratio data FA that corresponds to the input clock CLKI0 in the case where the clock selection command SELCK is "0", selects the division ratio data FB that corresponds to the input clock CLKI1 in the case where the clock selection command SELCK is "1", and supplies the selected division ratio data to the down counter 6a as the division ratio data DIVF.

The foregoing is the detailed configuration of the clock generation circuit according to an embodiment of the invention.

Figure 3:
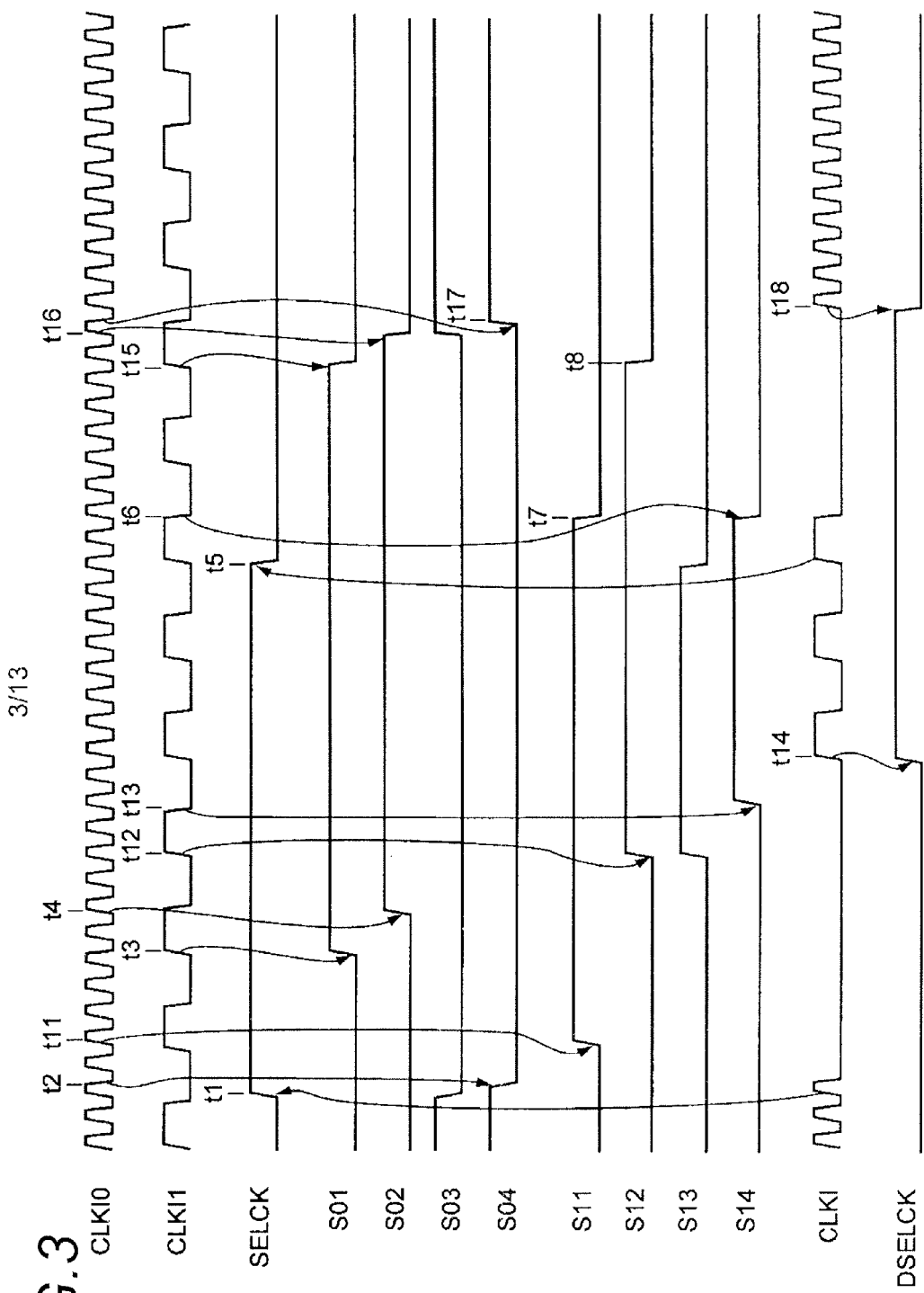
FIG. 3 is a time chart illustrating an operation of a clock switching unit in the clock generation circuit.

Next, the operation according to an embodiment of the invention will be described. FIG. 3 is a time chart illustrating the details of the clock switching operation of the clock switching unit 7. In an example as illustrated in FIG. 3, an initial state is set to SELCK="0", S01="0", S02="0", S03="1", S04="1", S11="0", S12="0", S13="0", and S14="0". In this case, the input clock CLKI0 passes through the AND gate 707 and the OR gate 730, and is output as the input clock CLKI.

Next, if the clock selection command SELCK rises from "0" to "1" (at time t1) in synchronization with the rising edge of the input clock CLKI=CLKI0, the output signal S03 of the AND gate 705 becomes "0", this output signal s03 is written in the flip-flop 706 by the falling edge of the subsequent input clock CLKI0, and the output signal S04 of the flip-flop 706 becomes "0" (at time t2). Accordingly, the AND gate 707 prevents the input clock CLKI0 from passing through the AND gate 707, and thus the input clock CLKI stops. Thereafter, the clock selection command SELCK="1" sequentially passes through the flip-flops 701 and 702 in synchronization with the rising edge of the input clock CLKI1, and thus the output signal S01 of the flip-flop 702 becomes "1" (at time t3). This signal S01="1" sequentially passes through the flip-flops 703 and 704 in synchronization with the rising edge of the input clock CLKI0, and thus the output signal S02 of the flip-flop 704 becomes "1" (at time t4).

On the other hand, the clock selection command SELCK="1' sequentially passes through the flip-flops 711 and 712 in synchronization with the rising edge of the input clock CLKI0, and thus the output signal S11 of the flip-flop 712 becomes "1" (at time t11). This signal S11="1" sequentially passes through the flip-flops 713 and 714 in synchronization with the rising edge of the input clock CLKI1, and thus the output signal S12 of the flip-flop 714 becomes "1" (at time t12). As a result, the output signal S13 of the AND gate 715 becomes "1". This signal S13="1" is written in the flip-flop 716 by the falling edge of the input clock CLKI1, and thus the output signal S14 of the flip-flop 716 becomes "1" (at time t13). As a result, the input clock CLKI1 passes through the AND gate 717 from the rising edge that is next to the falling edge of the input clock CLKI1 that sets the output signal S14 of the flip-flop 716 rise to "1", and is output as the input clock CLKI (at time t14).

Since the signals become S03="0" and S13="1" when an initial rising edge of the input clock CLKI1 is output from the OR gate 720 after the input clock CLKI stops, the output signal of the AND gate 811 becomes "1". As a result, the signal "1" is written in the flip-flop 812 by an initial rising edge of the same input clock CLKI1. Because of this, the clock determination signal DSELCK that the flip-flop 812 outputs rises from "0" to "1" when the output of the OR gate 720, of which the input clock CLKI1 is designated by the clock selection command SELCK="1", starts.

Next, if the clock selection command SELCK falls from "1" to "0" (at time t5) in synchronization with the rising edge of the input clock CLKI=CLKI1, the output signal S13 of the AND gate 715 becomes "0". This signal S13 is written in the flip-flop 716 by the falling edge of the subsequent input clock CLKI1, and thus the output signal S14 of the flip-flop 716 becomes "0" (at time t6). Accordingly, the AND gate 717 prevents the input clock CLKI1 from passing through the AND gate 717, and thus the input clock CLKI1 stops. Thereafter, the clock selection command SELCK="0" sequentially passes through the flip-flops 711 and 712 in synchronization with the rising edge of the input clock CLKI0, and thus the output signal S11 of the flip-flop 712 becomes "0" (at time t7). This signal 511=0" sequentially passes through the flip-flops 713 and 714 in synchronization with the rising edge of the input clock CLKI1, and thus the output signal S12 of the flip-flop 714 becomes "0" (at time t8).

On the other hand, the clock selection command SELCK="0" sequentially passes through the flip-flops 701 and 702 in synchronization with the rising edge of the input clock CLKI1, and thus the output signal S01 of the flip-flop 702 becomes "0" (at time t15). This signal S01="0" sequentially passes through the flip-flops 703 and 704 in synchronization with the rising edge of the input clock CLKI0, and thus the output signal S02 of the flip-flop 704 becomes "0" (at time t16). As a result, the output signal S03 of the AND gate 705 becomes "1". This signal S03="1" is written in the flip-flop 706 by the falling edge of the input clock CLKI0, and thus the output signal S04 of the flip-flop 706 becomes "1" (at time t17). As a result, the input clock CLKI0 passes through the AND gate 707 from the rising edge that is next to the falling edge of the input clock CLKI0 that sets the output signal S04 of the flip-flop 706 rise to "1", and is output as the input clock CLKI (at time t18).

Since the signals become S03="1" and S13="0" when the initial rising edge of the input clock CLKI0 is output from the OR gate 720 after the input clock CLKI stops, the output signal of the AND gate 811 becomes "0". As a result, the signal "0" is written in the flip-flop 812 by the initial rising edge of the same input clock CLKI0. Because of this, the clock determination signal DSELCK that the flip-flop 812 outputs falls from "1" to "0" when the output of the OR gate 720, of which the input clock CLKI0 is designated by the clock selection command SELCK="0", starts.

The foregoing is the detailed clock switching operation of the clock switching unit 7. According to this clock switching unit 7, even under the circumstances where the frequencies of the input clocks CLKI0 and CLKI1 are greatly different from each other, the clock switching can be performed without appearing glitch in the waveform of the input clock CLKI that is obtained from the OR gate.

Figure 4:
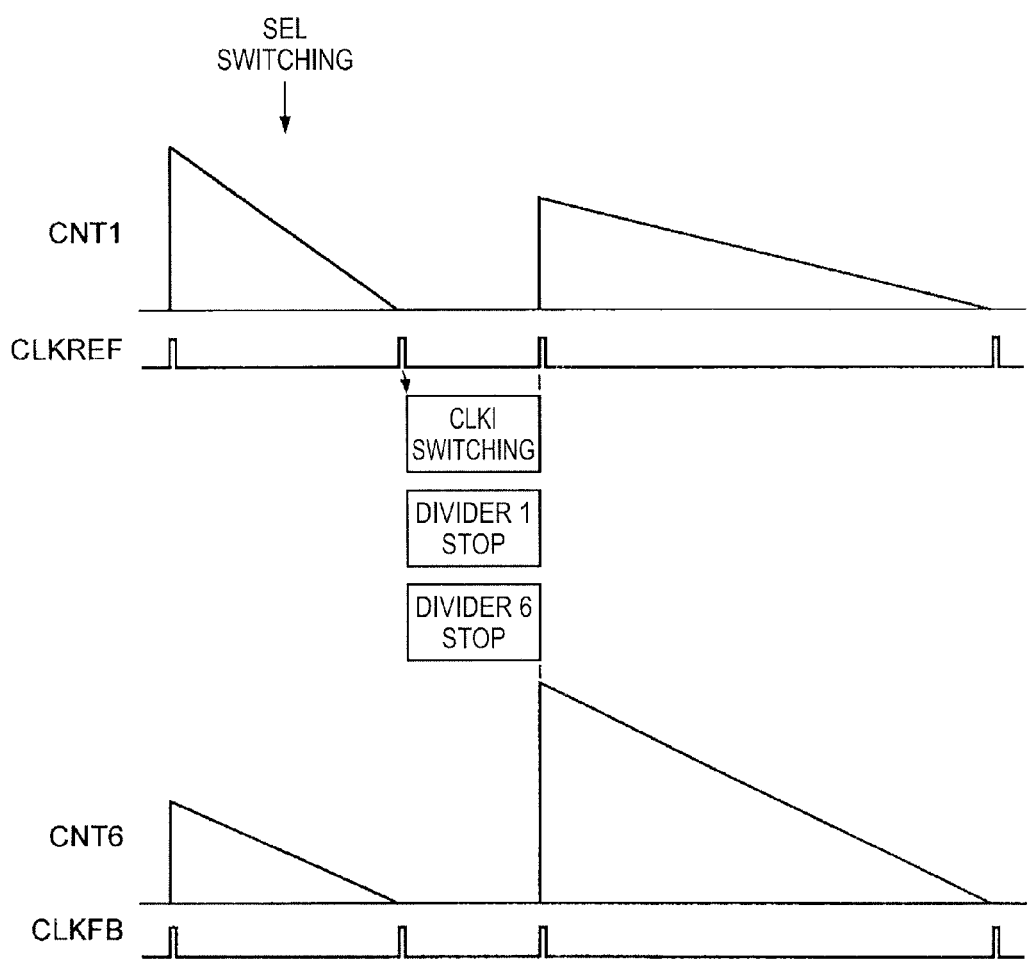
FIG. 4 is a time chart illustrating a brief operation of the clock generation circuit.

Next, the entire operation of the clock generation circuit according to an embodiment of the invention will be described. FIG. 4 is a time chart illustrating a brief operation of the clock generation circuit according to an embodiment of the invention. FIG. 4 illustrates the counted value CNT1 of the down counter 1a in the divider 1, the counted value CNT6 of the down counter 6a in the divider 6, the generation situation of the reference clock CLKREF and the feedback clock CLKFB, and the contents of control that is performed by the timing control unit 8.

In an illustrated example, the clock selection information SEL is switched in a period when the input clock CLKI is down-counted by the divider 1. In an embodiment of the invention, if the counted value CNT1 of the down counter 1a of the divider 1 becomes "0" after the clock selection information SEL is switched, the reference clock CLKREF is output. Here, under the circumstances where the reference clock CLKREF and the feedback clock CLKFB are phase-synchronized with each other, the feedback clock CLKFB is output around the time when the reference clock CLKREF is output.

When the reference clock CLKREF is output after the switching of the clock selection information SEL, the timing control unit 8 switches the clock selection command SELCK according to the clock selection information SEL, and makes the clock switching unit 7 start the switching of the input clock based on the clock selection information SEL. Also, while the switching of the input clock is performed, the timing control unit 8 resets the dividers 1 and 6 to set the counted values CNT1 and CNT6 to "0", and stops the counting operation of the dividers 1 and 6.

Also, to match the completion of the clock switching operation by using the clock switching unit 7 and the start of output of the input clock CLKI0 or CLKI1 from the clock switching unit 7 that is instructed by the clock selection command SELCK, the timing control unit 8 makes the dividers 1 and 6 start the down count for the division ratio that corresponds to a new input clock. Accordingly, when the dividers 1 and 6 start the down count that corresponds to a new division ratio, the dividers 1 and 6 outputs the reference clock CLKREF and the feedback clock CLKFB. Thereafter, the divider 1 outputs the reference clock CLKREF everytime it down-counts the input clock CLKI as many as the number that corresponds to the new division ratio, and the divider 6 outputs the feedback clock CLKFB everytime it down-counts the output clock CLKO as many as the number that corresponds to the new division ratio. In this case, the dividers 1 and 6 almost simultaneously start the division operation based on the new division ratio that corresponds to the input clock CLKI after the switching, and thus output reference clock CLKREF and feedback clock CLKFB respectively which are almost phase-matched to each other.

Figure 5:
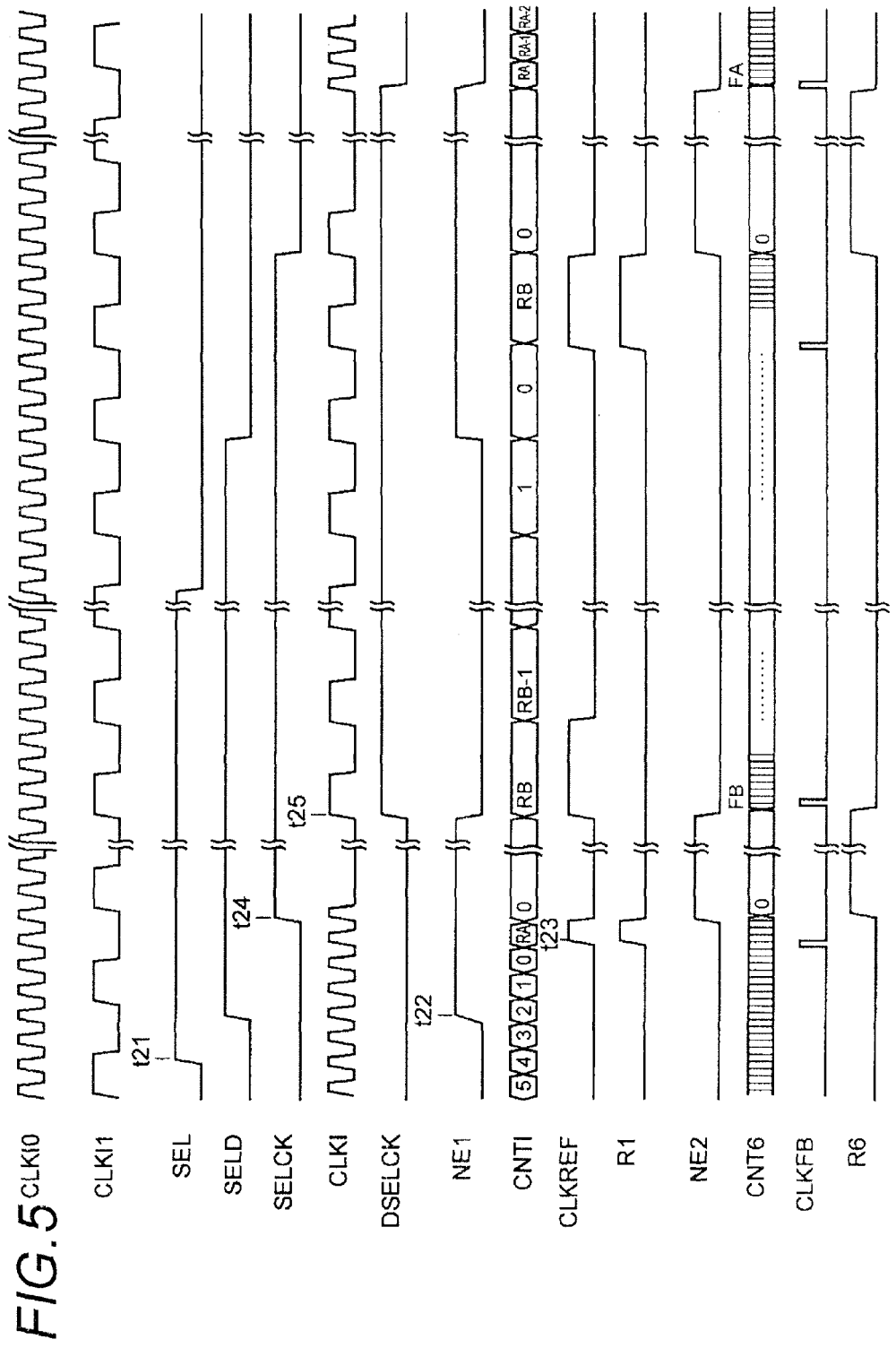
FIG. 5 is a time chart illustrating a detailed operation of the clock generation circuit.
Figure 6:
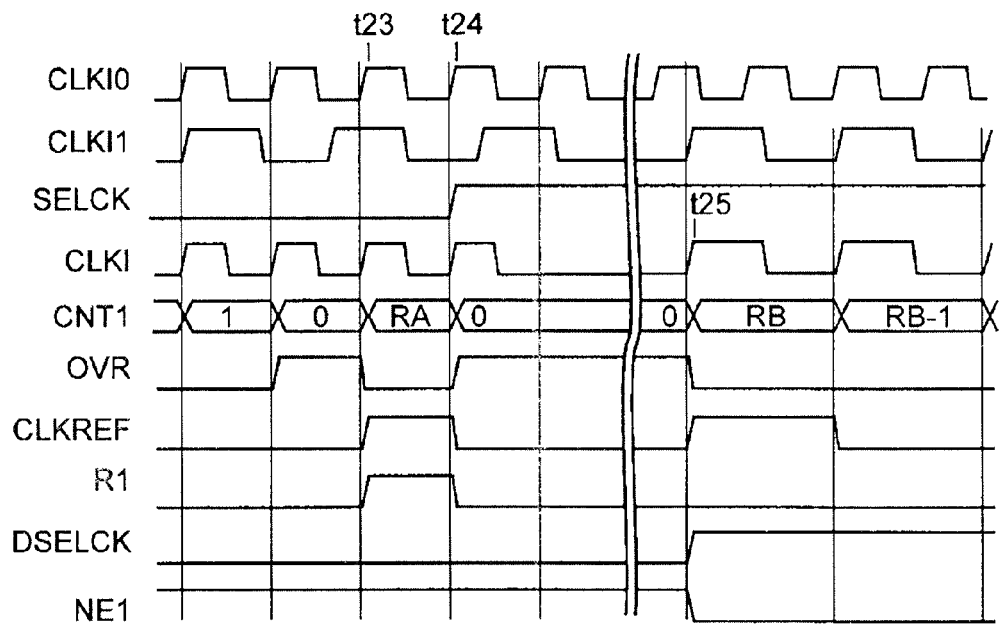
FIG. 6 is a time chart illustrating a detailed operation around the time when the clock switching starts and a detailed operation around the time when the clock switching is completed in the clock generation circuit.
Figure 7:
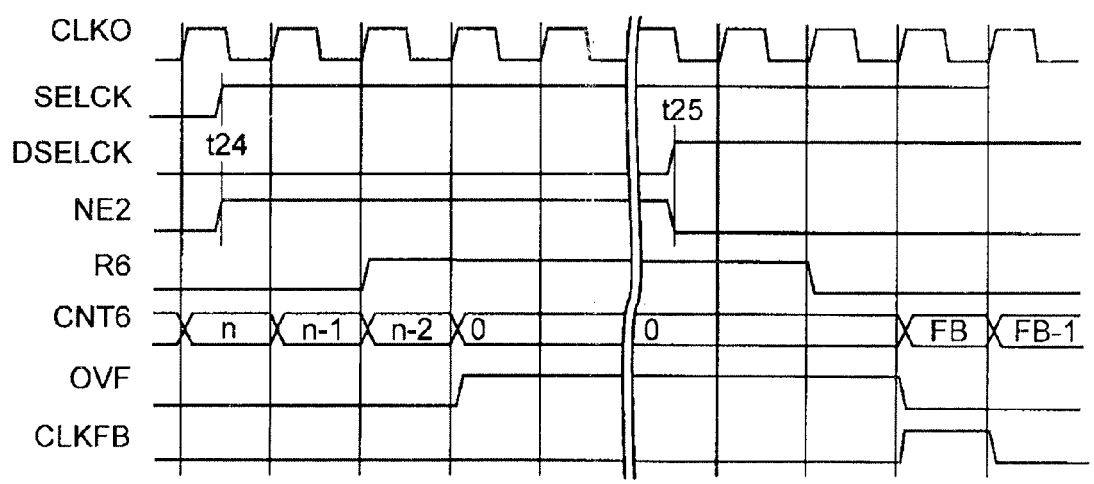
FIG. 7 is a time chart illustrating a detailed operation around the time when the clock switching starts and a detailed operation around the time when the clock switching is completed in the clock generation circuit.

FIG. 5 is a time chart illustrating a detailed operation of the clock generation circuit as described above. Also, FIGS. 6 and 7 are time charts illustrating a detailed operation around the time t24 when the clock switching starts and a detailed operation around the time t25 when the clock switching is completed. In the illustrated example, the signals become SEL="0", SELCK="0", and DSELCK="0" in the initial state, the input clock CLKI0 is output as the input clock CLKI, and the divider 1 down-counts the input clock CLKI=CLKI0. Also, if the clock selection information SEL rises from "0" to "1" (at time t21), this clock selection information SEL="1" sequentially passes through the flip-flops 801 and 802 in synchronization with the rising edge of the input clock CLKI=CLKI0, and thus the output signal SELD of the flip-flop 802 becomes "1". As a result, the inconsistency detection unit 821 makes the inconsistency detection signal NE1 rise from "0" to "1" (at time t22).

Thereafter, if the counted value CNT1 of the down counter 1a of the divider 1 becomes "0", as illustrated in FIG. 6, the count end signal OVR becomes "1", and this signal OVR="1" is written in the flip-flop 1b by the rising edge of the next input clock CLKI=CLKI0. As a result, the flip-flop 1b makes the reference clock CLKREF rise from "0" to "1" (at time t23). At this time, the down counter 1a receives the division ratio data RA that is output from the multiplexer 823 at that time as the counted value CNT1 by the rising edge of the input clock CLKI=CLKI0, and sets the count end signal OVR to "0", Also, when the reference clock CLKREF becomes "1", the AND gate 822 sets the reset signal R1 to "1".

Also, if the input clock CLKI=CLKI0 rises after the reference clock CLKREF becomes "1", the output signal SELD="1" of the flip-flop 802 is written in the flip-flop 803 by the rising edge of the input clock, and thus the clock selection command SELCK goes from "0" to "1" (at time t24). Accordingly, the clock switching unit 7 starts an operation for switching the input clock CLKI from the input clock CLKI0 to the input clock CLKI1, and for a short time, the output of the input clock CLKI is interrupted. Also, by the rising of the input clock CLKI=CLKI0 after the reference clock CLKREF becomes "1", the count end signal OVR="0" that the down counter 1a outputs at that time is written in the flip-flop 1b to set the reference clock CLKREF to "0", and the down counter 1a, to which the reset signal R1="1" is input at that time, is reset to set the counted value CNT1 of the down counter 1a to "0" and to set the count end signal OVR to "1". Thereafter, since the input clock CLKI is interrupted, the down counter 1a keeps the counted value CNT1="0" and the count end signal OVR="1", and the flip-flop 1b keeps the reference clock CLKREF "0" (refer to the left side of FIG. 6).

In a state where the reference clock CLKREF and the feedback clock CLKFB are synchronized with each other, the divider 6 outputs the feedback clock CLKFB (refer to around the time t23 in FIG. 5) almost at the same time when the divider 1 outputs the reference clock CLKREF.

On the other hand, when the clock selection command SELCK goes from "0" to "1" (at time t24) as illustrated in FIG. 7, the inconsistency detection unit 831 makes the inconsistency detection signal NE2 rise to "1". This inconsistency detection signal NE2="1" sequentially passes through flip-flops 832 and 833 in synchronization with the rising edge of the output clock CLKO, and is supplied to the down counter 6a and the flip-flop 6b as the reset signal R6. Also, if the output clock CLKO rises after the reset signal R6 becomes "1", the down counter 6a and the flip-flop 6b are reset, and thus the counted value CNT6 of the down counter 6a becomes "0", the count end signal OVF becomes "1", and the feedback clock CLKFB becomes "0". Here, the flip-flops 832 and 833 serve to synchronize the inconsistency detection signal NE2 that is changed in synchronization with the input clock CLKI with the output clock CLKO, and somewhat delays the supply of the reset signal R6="1" so that the reset signal R6="1" is supplied to the down counter 6a and the flip-flop 6b after the divider 6 outputs the feedback clock CLKFB almost at the same time as the reference clock CLKREF.

Thereafter, since the reset signal R6="1" is supplied to the down counter 6a and the flip-flop 6b while the inconsistency detection signal NE2 is "1", the signals are kept in the states of CNT6="0", OVF="1", and CLKFB="0" (refer to the left side of FIG. 7).

Thereafter, if the clock switching unit 7 completes the clock switching operation and starts the operation of outputting the input clock CLKI1 that is designated by the clock selection command SELCK="1" as the input clock CLKI (at time t25), as illustrated in FIG. 6, the count end signal OVR="1" that the down counter 1a outputs is written in the flip-flop 1b by the rising edge of the initial input clock CLKI=CLKI1 after the switching, and thus the reference clock CLKREF becomes "1". Also, since the signal becomes SELCK="1" when the rising edge of the initial input clock CLKI=CLKI1 is generated, the multiplexer 823 outputs the division ratio data RB that corresponds to the input clock CLKI1. Because of this, the down counter 1a receives the division ratio data RB by the rising edge of the initial input clock CLKI=CLKI1 to output the division ratio data RB as the counted value CNT1, and sets the count end signal OVR to "0".

Next, if the second input clock CLKI=CLKI1 is output from the clock switching unit 7 after the clock switching, the count end signal OVR="0" that the down counter 1a outputs is written in the flip-flop 1b by the rising edge of the input clock CLKI=CLKI1, and thus the reference clock CLKREF becomes "0". Also, the down counter 1a sets the counted value CNT1 to RB−1 by the rising edge of the second input clock CLKI=CLKI1. Thereafter, the divider 1 down-counts the input clock CLKI=CLKI1. If the counted value CNT1 becomes "0", the down counter 1a repeats to generate the reference clock CLKREF, receive the division ratio data RB to output the same as the counted value CNT1, and down-count the input clock CLKI=CLKI1 again (refer to the right side of FIG. 6).

On the other hand, if the operation of outputting the input clock CLKI1 as the input clock CLKI starts (at time t25) and the inconsistency detection signal NE2 becomes "0", as illustrated in FIG. 7, the reset signal R6 become "0" in synchronization with the second rising edge of the output clock CLKO. Also, if the reset signal R6 become "0", the count end signal OVF="1" that the down counter 6a outputs is written in a flip-flop 6b in the divider 6 when the subsequent output clock CLKO rises, and thus the feedback clock CLKFB becomes "1". Also, since the clock selection command SELCK is "1" at a time when the output clock CLKO rises, the multiplexer 834 outputs the division ratio data FB that corresponds to the input clock CLKI1. Because of this, by the rising of the output clock CLKO, the down counter 6b receives the division ratio data FB as the counted value CNT6, and sets the count end signal OVF to "0".

Thereafter, if the subsequent output clock CLKO is generated, the count end signal OVF="0" that the down counter 6a outputs is written in the flip-flop 6b in the divider 6, and the feedback clock CLKFB becomes "0". Also, by the rising of the output clock CLKO, the down counter 6b sets the counted value CNT6 to FB−1. Then, the divider 6 down-counts the output clock CLKO. If the counted value CNT6 becomes "0", the down counter 6b repeats to generate the feedback clock CLKFB, receive the division ratio data FB to output the same as the counted value CNT6, and down-count the output clock CLKO again (refer to the right side of FIG. 7).

Although the operation when the clock selection information SEL is switched from "0" to "1" has been described, the operation when the clock selection information SEL is switched from "1" to "0" is the same (refer to the right side of FIG. 5).

As described above, according to an embodiment of the invention, when the reference clock CLKREF is output after the clock selection information SEL is switched, the clock switching operation by using the clock switching unit 7 starts and the dividers 1 and 6 are stopped while the clock switching is performed. Also, to match the completion of the clock switching operation and the start of output of the input clock CLKI0 or CLKI1 that is instructed by the clock selection information SEL, the dividers 1 and 6 are made to start the division operation (down count) of the division ratio that corresponds to a new input clock after the switching. Accordingly, the timing of generating the reference clock CLKREF and the timing of generating the feedback clock CLKFB after the switching of the input clock can almost coincide with each other after the switching of the input clock, and thus the loop unit 2 is prevented from moving out of synchronization.

<Second Embodiment>

Figure 8:
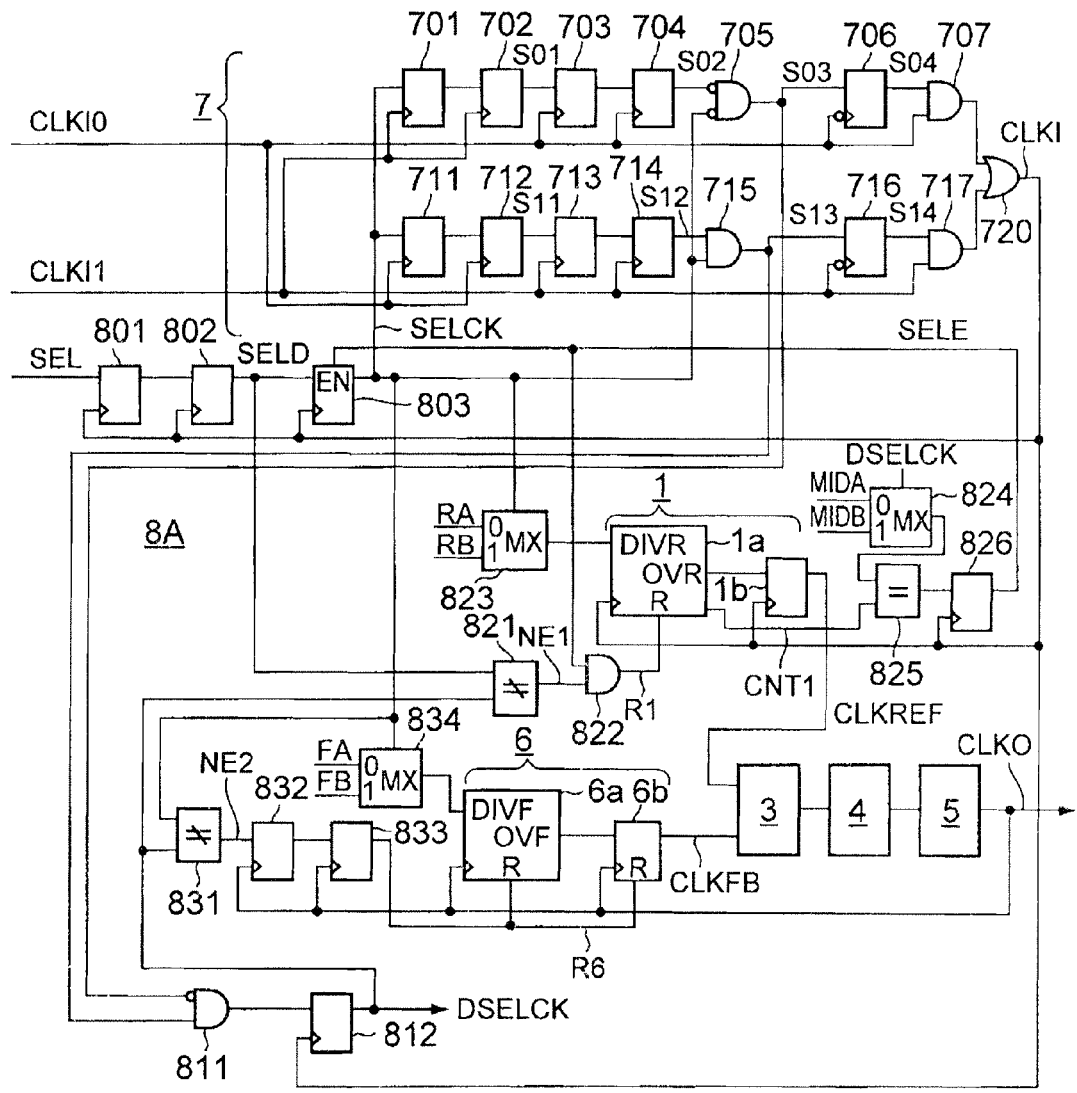
FIG. 8 is a circuit diagram illustrating the configuration of a clock generation circuit according to a second embodiment of the invention.
Figure 9:
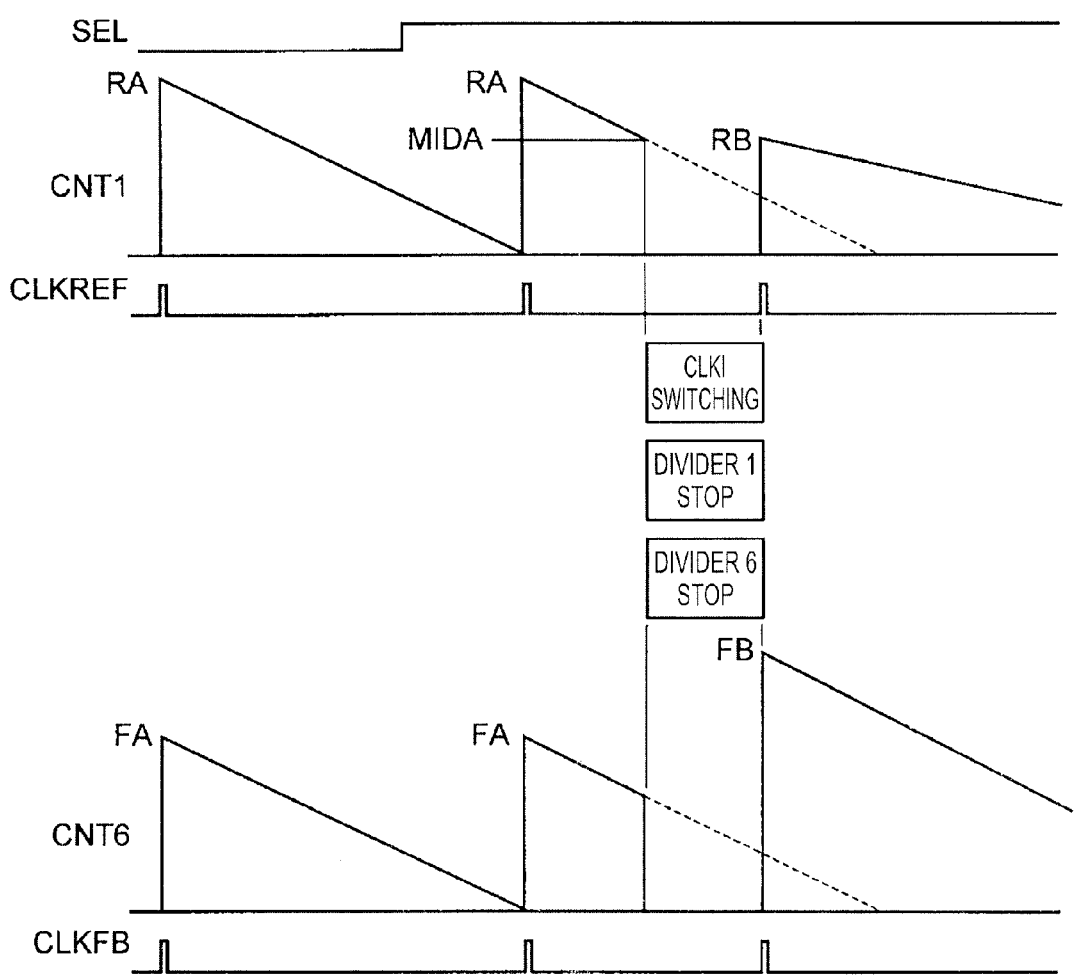
FIG. 9 is a time chart illustrating a brief operation of the clock generation circuit.
Figure 10:
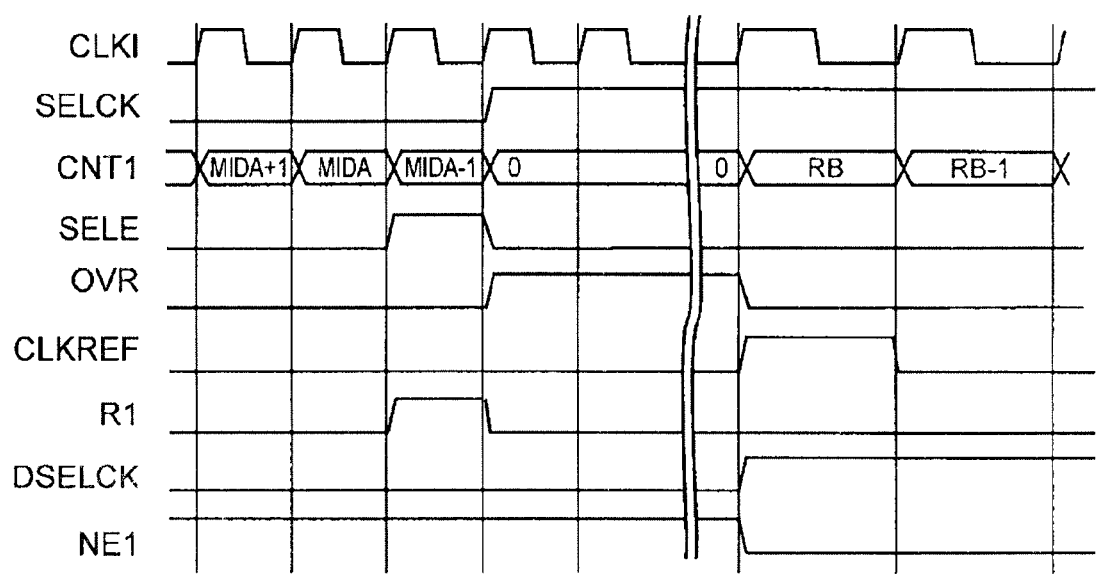
FIG. 10 is a time chart illustrating a detailed operation around the time when the clock switching starts and a detailed operation around the time when the clock switching is completed in the clock generation circuit.

FIG. 8 is a circuit diagram illustrating the configuration of a clock generation circuit according to a second embodiment of the invention. FIG. 9 is a time chart illustrating a brief operation of the clock generation circuit, and FIG. 10 is a time chart illustrating waveforms of respective units according to the embodiment of the invention. According to the first embodiment of the invention as described above, in the case where the clock selection information SEL is switched, the counted value CNT1 of the input clock CLKI in the divider 1 becomes "0" thereafter, and when the reference clock CLKREF is output, the clock selection command SELCK is switched to match the clock selection information SEL. According to this second embodiment of the invention, as illustrated in FIG. 9, in the case where the clock selection information SEL is switched from "0" to "1" in a period when the divider 1 performs the division operation based on the division ratio data RA, for example, the counted value CNT1 of the input clock CLKI of the divider 1 is made to be switching reference data MIDA that corresponds to an intermediate value between the division ratio data RA and "0" (for example, MIDA=RA/2) after the clock selection information SEL is switched, and thus the clock selection command SELCK is switched to match the clock selection information SEL.

In order to realize the switching of the clock selection command SELCK as described above, as illustrated in FIG. 8, a timing control unit 8A of the clock generation circuit according to this embodiment includes a multiplexer is 824, a coincidence detection unit 825, and a flip-flop 826.

Here, the multiplexer 824 outputs the switch reference data MIDA (for example, MIDA=RA/2) that is set to correspond to the division operation of the input clock CLKI0 in the case where the clock determination signal DSELCK is "0" (that is, in the case where the input clock CLKI0 is currently output from the clock switching unit 7), and outputs switch reference data MIDB (for example, MIDB=RB/2) that is set to correspond to the division operation of the input clock CLKI1 in the case where the clock determination signal DSELCK is "1" (that is, in the case where the input clock CLKI1 is currently output from the clock switching unit 7). The consistency detection unit 825 outputs "1" in the case where the counted value CNT1 of the down counter 1a of the divider 1 coincides with the output data of the multiplexer 824, and outputs "0" in the case where the counted value CNT1 does not coincide with the output data of the multiplexer 824. The flip-flop 826 receives the output signal of the coincidence detection unit 825 by the rising edge of the input clock CLKI, and supplies the received signal to an enable terminal EN of the flip-flop 803 as the signal SELF.

According to this configuration, as illustrated in FIG. 10, in the case where the counted value CNT1 of the divider 1 coincides with the switch reference data MIDA after the clock selection information SEL goes from "0" to "1", the signals SELF and the reset signal R1 become "1" by the rising edge of the subsequent input clock CLKI, and the down counter 1a is reset by the rising edge of the second input clock CLKI to set the counted value CNT1 to "0" and to set the count end signal OVR to "1". Also, the clock selection command SELCK is switched from "0" to "1" by the rising edge of the second input clock CLKI, and the clock switching unit 7 starts the operation for switching the input clock CLKI from the input clock CLKI0 to the input clock CLKI1. During this operation, the output of the input clock signal CLKI is interrupted, and thus divider 1 keeps the states of CNT1="0" and OVR="1".

Thereafter, if the clock switching unit 7 completes the clock switching operation and outputs the initial input clock CLKI=CLKI1 after the clock switching, the flip-flop 1b of the divider 1 receives the count end signal OVR="1" at that time in synchronization with the rising edge of the input clock CLKI, and outputs the received signal as the reference clock CLKREF. Also, the down counter 1a of the divider 1 receives the division ratio data RB in synchronization with the rising edge of the input clock CLKI to set the counted value CNT1 to RB and to set the count end signal OVR to "0". On the other hand, when the initial input clock CLKI=CLKI1 is output after the clock switching, the clock determination signal DSELCK is switched from "0" to "1" to set the inconsistence detection signal NE1 to "0".

Next, if the second input clock CLKI is output after the clock switching, the count end signal OVR is written in the flip-flop 1a to set the reference clock CLKREF to "0", and the down counter 1a sets the counted value CNT1 to RB−1.

Thereafter, the down counter 1a down-counts the input clock CLKI. Also, everytime the counted value CNT1 becomes "0", it is repeated to generate the reference clock CLKREF and to set the division ratio data RB to the counted value CNT1.

Other operations are the same as those according to the first embodiment of the invention.

In this embodiment of the invention, the same effect as that according to the first embodiment of the invention is obtained.

<Other Embodiments>

As described above, the first and second embodiments of the invention have been described. In addition, various kinds of embodiments of the invention may be considered, for example, as follows.

(1) In the above described embodiments, the clock switching unit 7 selects and outputs one of two kinds of input clocks. However, a clock switching unit that selects and outputs one of three or more kinds of input clocks may be adopted.

(2) In the above described embodiments, the clock selection command SELCK is switched according to the counted value of the divider 1 which becomes a predetermined value after the clock selection information SEL is switched. However, it is also possible to switch the clock selection command SELCK according to the counted value of the divider 6 which becomes a predetermined value after the clock selection information SEL is switched.

(3) In the above described embodiments, the division ratio data RA, RB, FA, and FB are determined so that the frequencies of the output clock CLKO become equal to each other before and after the switching of the input clock CLKI. However, if determination of such division ratio data RA, RB, FA, and FB is difficult and the phase difference between the reference clock CLKREF and the feedback clock CLKFB is not serious, the division ratio data may be set so as to change the frequency of the output clock CLKO.

(4) In the above described embodiments, the clock selection command SELCK for the clock switching unit 7 is switched after the switching of the clock selection information SEL, the setting of the number of input clocks R(=DIVR+1) for outputting one reference clock in the divider 1 and the number of output clocks F(=DIVF+1) for outputting one feedback clock in the divider 6 is switched, and when the clock determination signal DSELCK, which indicates the start of the output of the input clock that is designated by the clock selection command SELCK after the switching of the clock switching unit 7, is generated, the dividers 1 and 6 start the count operations that correspond to the number of new settings after the switching. However, as an opportunity for making the dividers 1 and 6 start the count operations that correspond to the number of new settings after the switching, things except for the change of the clock determination signal DSELCK may be adopted. For example, in the case where the clock selection command SELCK is switched and then the clock generation circuit includes a node at which the signal is certainly changed, the signal change of such a node may be adopted as the opportunity for making the dividers 1 and 6 start the count operations that correspond to the number of new settings after the switching. A signal for such opportunity may not be the clock determination signal DSELCK in the above described embodiments, and may be, for example, a signal that is obtained by delaying the clock selection command SELCK for a predetermined time.

(5) In the above described embodiments, the division ratio data RA, RB, FA, and FB are set so that the frequencies of the output clock CLKO become equal to each other before and after the switching of the input clock CLKI. However, even if either one of division ratio data R for the divider 1 and division ratio data F for the divider 6 is set, the same effect as that according to the above described embodiments of the invention is obtained.

More specifically, if it is assumed that the frequency of the input clock CLKI0 is fi, the frequency of the output clock CLKO of the VCO 5 is fo, a relation between the division ratio data R and F and the frequencies fi and fo satisfies the following equation (3).

$$fo = fi^*(F+1)/(R+1) \quad (3)$$

As indicated in the equation (3), when the frequency fi of the input clock CLKI0 is changed, for example, a ratio of the frequencies fi before and after the change is an integer number, either one of the division ratio data R and the division ratio data F can be set so as not to change the frequency of the output clock CLKO.

Figure 11A:
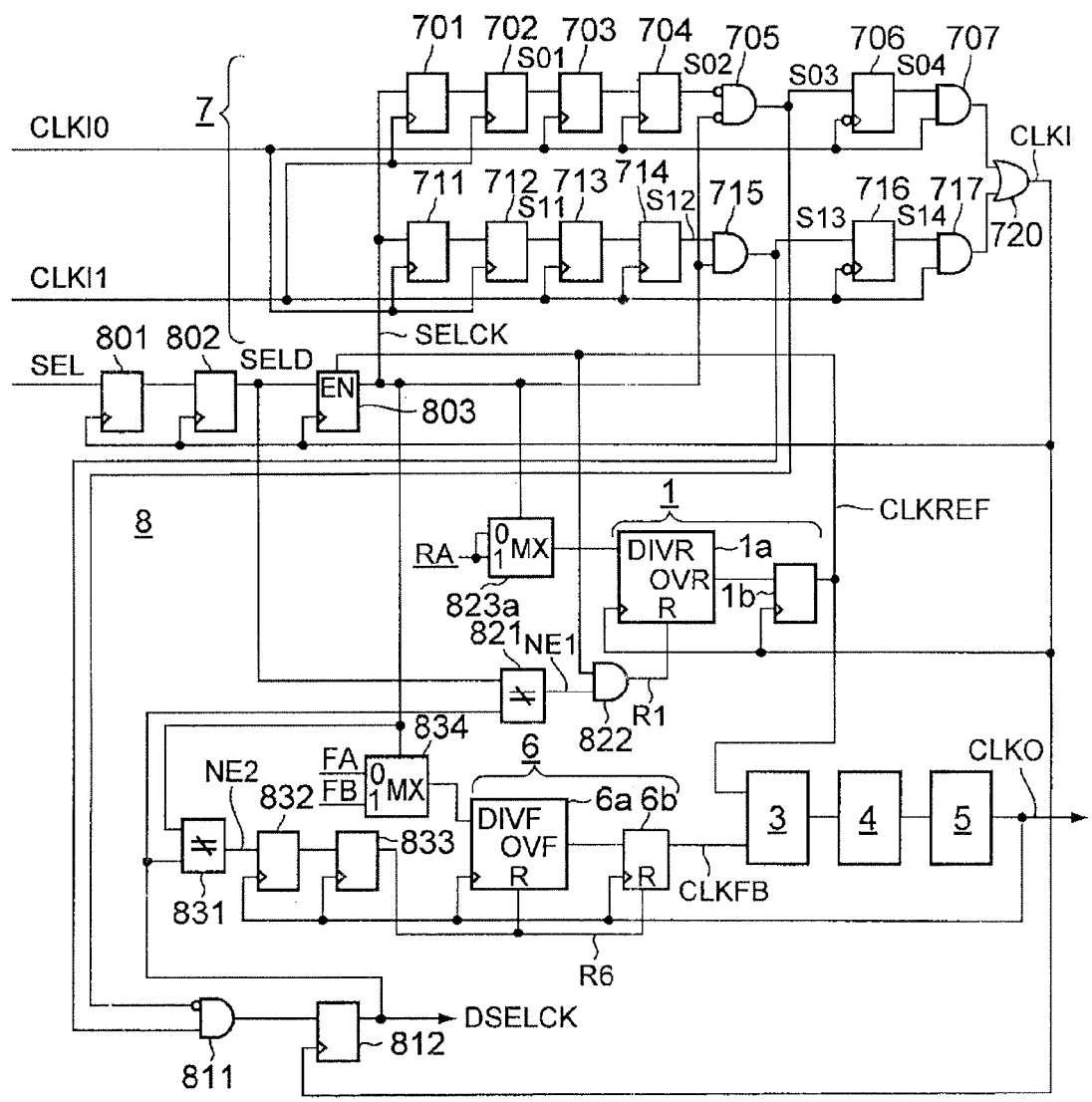
FIGS. 11A and 11B are circuit diagrams illustrating a detailed configuration of a modified clock generation circuit.
Figure 11B:
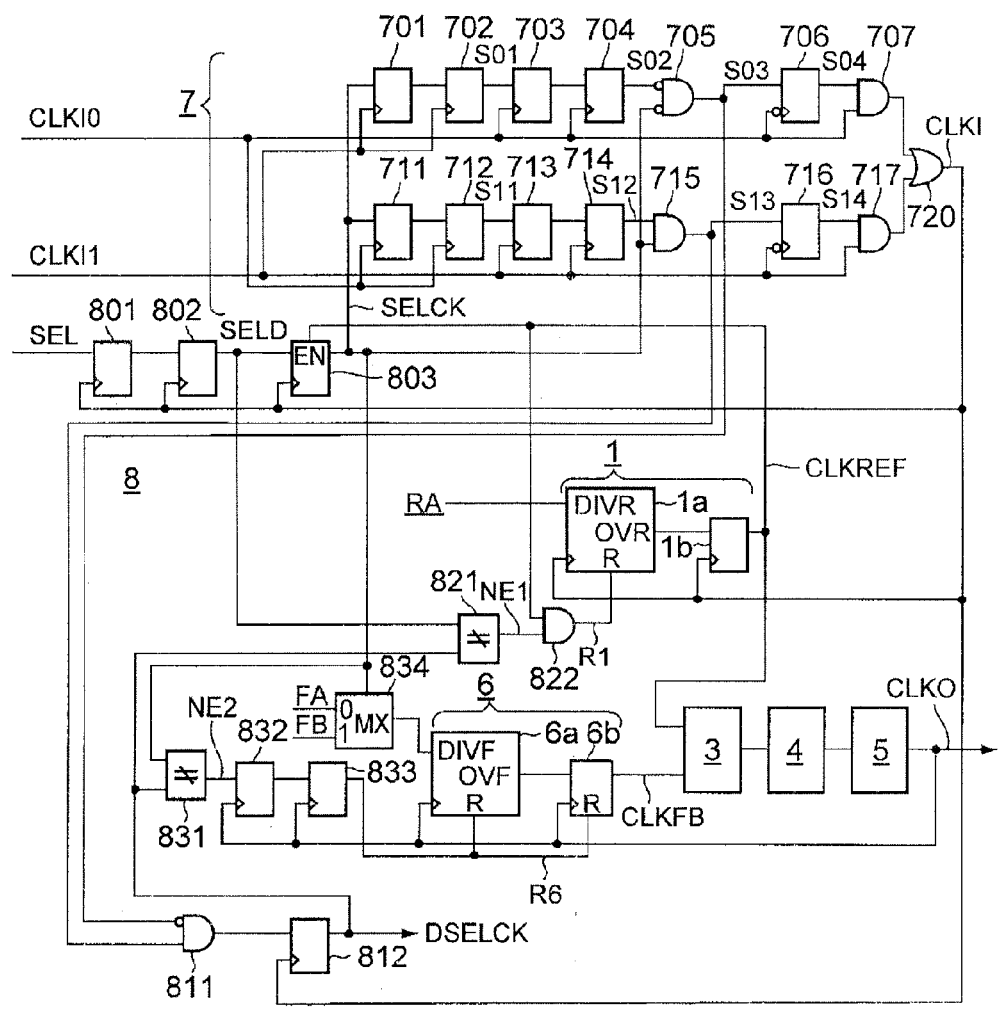

FIGS. 11A and 11B are circuit diagrams illustrating a detailed configuration of a modified clock generation circuit. The configuration of the clock generation circuit in FIG. 11A is same as that of the clock generation circuit in FIG. 2 without a multiplexer 823a. In FIG. 11A, the multiplexer 823a supplies the division ratio data RA to the down counter 1a as the division ratio data DIVR independent of a value of the clock selection command SELCK. Also, due to the multiplexer 834, the division ratio data FA or the division ratio data FB can be selected on the basis of a value of the clock selection command SELCK.

Also, the configuration of the clock generation circuit in FIG. 11B is substantially same as that of the clock generation circuit in FIG. 2. However, the multiplexer 823 is eliminated, and the division ratio data RA is supplied to the down counter ha as the division ratio data DIVR independent of the clock selection command SELCK in FIG. 11B. In FIG. 11B, due to the multiplexer 834, the division ratio data FA or the division ratio data FB can be selected on the basis of a value of the clock selection command SELCK.

The multiplexer 823a in FIG. 11A or the configuration of an input (the division ratio data RA) to the down counter 1a in FIG. 11B can be applied to the configuration of the clock generation circuit according to the second embodiment shown in FIG. 8.

Finally, JP-A-2001-126411 discloses a technique of switching the division ratio when a feedback clock is obtained by dividing an output clock according to the frequency of an input signal to make the frequency of the output clock of a PLL constant. However, JP-A-2001-126411 does not relate to the technology that performs the switching of the input clock in a state where the PLL is operated as in the present invention, and thus discloses no means for preventing the operation of the PLL from becoming unstable according to the switching of the input clock.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2010-189050 filed on Aug. 26, 2010, the contents of which are incorporated herein by reference.

What is claimed is:

1. A clock generation circuit comprising:
   a first divider that outputs a reference clock everytime the number R (R is an integer) of input clocks are counted;
   a loop unit that includes a second divider which outputs a feedback clock everytime the number F (F is an integer) of output clocks are counted, and generates an output clock, which is in phase synchronization with the reference clock and has a frequency that is F times the reference clock, by controlling a frequency of the output clock based on a phase error between the reference clock and the feedback clock;
   a clock switching unit that selects one input clock which is designated by a clock selection command among a plurality of input clocks and supplies the selected input clock to the first divider; and
   a timing control unit that switches the clock selection command for the clock switching unit in accordance with switching of clock selection information which designates the input clock, switches at least one of a setting of the number R of the input clocks for outputting one reference clock to the first divider and a setting of the number F of the output clocks for outputting one feedback clock to the second divider, and starts both of a count operation by using the first divider of the input clock corresponding to the set number R after switching of the setting and a count operation by using the second divider of the output clock corresponding to the set number F after switching of the setting.

2. The clock generation circuit according to claim 1, wherein the timing control unit switches the clock selection command for the clock switching unit in accordance with a counted value of the input clock in the first divider or a counted value of the output clock in the second divider becoming a predetermined value after the clock selection information is switched, and makes the first divider and the second divider start the count operation of the input clock corresponding to the set number R after the switching of the setting and the count operation of the output clock corresponding to the set number F after the switching of the setting in time with the start of the output of the input clock designated by the switched clock selection command, by the clock switching unit.

3. The clock generation circuit according to claim 1, wherein the clock switching unit outputs the input clock which is delayed with respect to the switching of the clock selection command and designated by the clock selection command after the switching; and wherein the timing control unit stops the first divider and the second divider in accordance with the switching of the clock selection command for the clock switching unit, and makes the first divider and the second divider start the count operation of the input clock corresponding to the set number R after the switching of the setting and the count operation of the output clock corresponding to the set number F after the switching of the setting in time with the start of the output of the input clock designated by the switched clock selection command, by the clock switching unit.

4. The clock generation circuit according to claim 1, wherein the timing control unit stops the first divider in accordance with the switching of the clock selection command for the clock switching unit, and then stops the second divider after a period of time is elapsed.

5. The clock generation circuit according to claim 1, wherein the timing control unit switches the clock selection command for the clock switching unit in accordance with the first divider outputting the reference clock after the switching of the clock selection information.

* * * * *